(12) United States Patent
Shinohara

(10) Patent No.: US 11,503,234 B2
(45) Date of Patent: Nov. 15, 2022

(54) PHOTOELECTRIC CONVERSION DEVICE, IMAGING SYSTEM, RADIOACTIVE RAY IMAGING SYSTEM, AND MOVABLE OBJECT

(71) Applicant: CANON KABUSHIKI KAISHA, Tokyo (JP)

(72) Inventor: Mahito Shinohara, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 248 days.

(21) Appl. No.: 16/793,082

(22) Filed: Feb. 18, 2020

(65) Prior Publication Data

US 2020/0275039 A1 Aug. 27, 2020

(30) Foreign Application Priority Data

Feb. 27, 2019 (JP) .............................. JP2019-033868
Aug. 7, 2019 (JP) .............................. JP2019-145109

(51) Int. Cl.
*H04N 5/363* (2011.01)
*H01L 27/146* (2006.01)

(52) U.S. Cl.
CPC ....... *H04N 5/363* (2013.01); *H01L 27/14663* (2013.01)

(58) Field of Classification Search
CPC ...... H04N 5/363; H04N 5/3597; H04N 5/361; H04N 5/378; H01L 27/14663;
(Continued)

(56) References Cited

U.S. PATENT DOCUMENTS 4,962,412 A 10/1990 Shinohara
5,008,206 A 4/1991 Shinohara
(Continued)

FOREIGN PATENT DOCUMENTS

EP 3379575 9/2018
JP 2000-311997 11/2000
(Continued)

OTHER PUBLICATIONS

European Search Report dated Aug. 13, 2020 in corresponding European application No. EP 20159219.
(Continued)

*Primary Examiner* — Chiawei Chen
(74) *Attorney, Agent, or Firm* — Venable LLP

(57) ABSTRACT

A photoelectric conversion device includes a photoelectric conversion unit that generates signal charge of a first polarity and a charge conversion circuit that converts the signal charge into a signal voltage. The photoelectric conversion unit includes a first semiconductor region of a first conductivity type, a second semiconductor region of a second conductivity type that are provided in a surface side of a semiconductor substrate, a third semiconductor region of the first conductivity type provided at a first depth, a fourth semiconductor region of the second conductivity type provided at a second depth and overlaps the second semiconductor region in a plan view, and a fifth semiconductor region of the first conductivity type provided at a third depth, and the third semiconductor region and the fifth semiconductor region overlap the first semiconductor region, the second semiconductor region, and the fourth semiconductor region in the plan view.

19 Claims, 10 Drawing Sheets

(58) Field of Classification Search
CPC ......... H01L 27/14647; H01L 27/14658; H01L 27/14607
See application file for complete search history.

(56) References Cited

U.S. PATENT DOCUMENTS

| | | | |
|---|---|---|---|
| 5,060,042 | A | 10/1991 | Shinohara |
| 5,086,326 | A | 2/1992 | Shinohara |
| 5,146,339 | A | 9/1992 | Shinohara |
| 5,280,358 | A | 1/1994 | Yushiya |
| 6,791,613 | B2 | 9/2004 | Shinohara |
| 6,828,601 | B2 | 12/2004 | Shinohara |
| 6,876,019 | B2 | 4/2005 | Shinohara |
| 7,250,970 | B2 | 7/2007 | Shinohara |
| 7,394,492 | B2 | 7/2008 | Shinohara |
| 7,741,593 | B2 | 6/2010 | Iwata |
| 7,821,551 | B2 | 10/2010 | Shinohara |
| 7,884,870 | B2 | 2/2011 | Shinohara |
| 8,063,966 | B2 | 11/2011 | Shinohara |
| 8,139,133 | B2 | 3/2012 | Iwane |
| 8,164,668 | B2 | 4/2012 | Iida |
| 8,345,137 | B2 | 1/2013 | Shinohara |
| 8,350,942 | B2 | 1/2013 | Shinohara |
| 8,436,406 | B2 * | 5/2013 | Shinohara ......... H01L 27/14632 257/291 |
| 8,471,942 | B2 | 6/2013 | Shinohara |
| 8,896,734 | B2 | 11/2014 | Shinohara |
| 8,970,769 | B2 | 3/2015 | Shinohara |
| 9,437,647 | B2 | 9/2016 | Shinohara |
| 10,535,688 | B2 | 1/2020 | Onuki |
| 10,771,720 | B2 | 9/2020 | Shinohara |
| 2001/0004117 | A1 * | 6/2001 | Chikamatsu ......... H01L 31/103 257/229 |
| 2003/0057431 | A1 | 3/2003 | Hiraku |
| 2004/0046194 | A1 | 3/2004 | Hiraku |
| 2005/0167710 | A1 | 8/2005 | Hiraku |
| 2005/0253946 | A1 | 11/2005 | Shinohara |
| 2008/0012048 | A1 * | 1/2008 | Kuroda ............. H01L 27/14806 257/222 |
| 2010/0044812 | A1 | 2/2010 | Hynecek |
| 2010/0187581 | A1 * | 7/2010 | Shinohara ......... H01L 27/14643 257/292 |
| 2011/0241089 | A1 * | 10/2011 | Ohri .................. H04N 5/37452 257/E31.085 |
| 2014/0086394 | A1 * | 3/2014 | Batkilin .................. G01T 7/005 378/207 |
| 2016/0071893 | A1 | 3/2016 | Shinohara |
| 2016/0247846 | A1 | 8/2016 | Iida |
| 2017/0005126 | A1 | 1/2017 | Yamazaki |
| 2017/0192090 | A1 * | 7/2017 | Roy ................. H01L 27/14612 |
| 2017/0301719 | A1 * | 10/2017 | Iwata ................ H01L 27/14645 |
| 2017/0359540 | A1 * | 12/2017 | Muto .................... H04N 5/369 |
| 2018/0184027 | A1 | 6/2018 | Shinohara |
| 2018/0219033 | A1 * | 8/2018 | Toyoguchi ............. G01C 3/085 |
| 2018/0350864 | A1 | 12/2018 | Toyoguchi |
| 2019/0110013 | A1 | 4/2019 | Shinohara |
| 2019/0198541 | A1 | 6/2019 | Shinohara |
| 2020/0052143 | A1 | 2/2020 | Morimoto |
| 2020/0058700 | A1 | 2/2020 | Shinohara |
| 2020/0111828 | A1 | 4/2020 | Onuki |

FOREIGN PATENT DOCUMENTS

| | | |
|---|---|---|
| JP | 2000-312024 | 11/2000 |
| JP | 2001237452 A | 8/2001 |
| JP | 2001245219 A | 9/2001 |
| JP | 2007184250 A | 7/2007 |
| JP | 2010114275 A | 5/2010 |
| JP | 2016-76647 | 5/2016 |
| JP | 2016152374 A | 8/2016 |
| JP | 201864086 A | 4/2018 |
| JP | 2018107409 A | 7/2018 |

OTHER PUBLICATIONS

Japanese Office Acton dated Feb. 9, 2021 issued in related Japanese Application No. 2019-145109 (with English language translation).

* cited by examiner

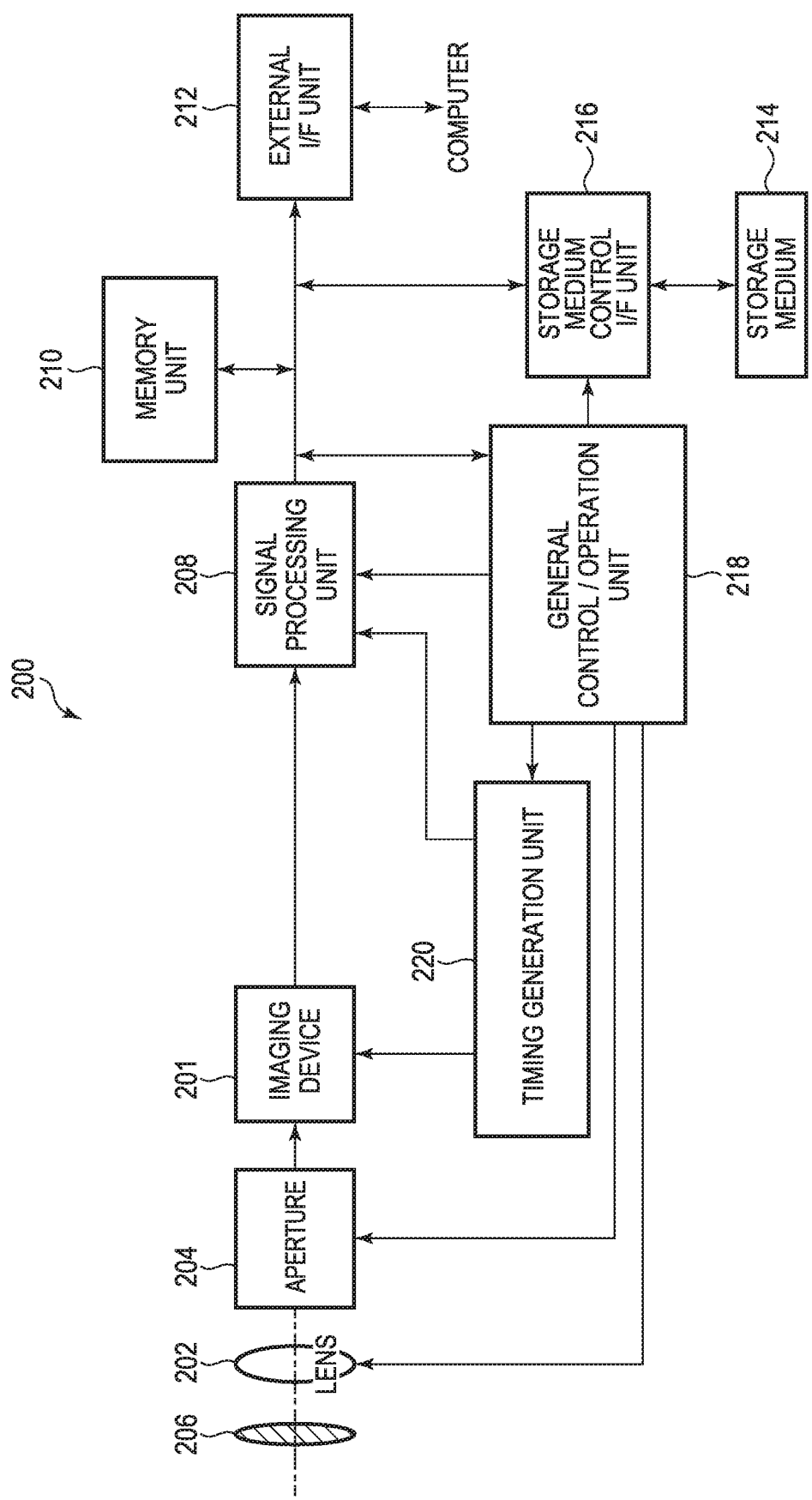

PHOTOELECTRIC CONVERSION DEVICE, IMAGING SYSTEM, RADIOACTIVE RAY IMAGING SYSTEM, AND MOVABLE OBJECT

BACKGROUND OF THE INVENTION

Field of the Invention

The present invention relates to a photoelectric conversion device, an imaging system, a radioactive ray imaging system, and a movable object.

Description of the Related Art

In photoelectric conversion devices used for automatic focus detection of cameras, automatic exposure adjustment of cameras, radioactive ray detection, or the like, some of the photoelectric conversion devices may have a photodiode with a large area having a diameter of around several tens to hundreds of micrometers. It is desirable that such a photodiode with a large area have large saturation charge amount and enable fast readout. Japanese Patent Application Laid-Open No. 2016-076647 discloses a technique for achieving high sensitivity and fast readout by improving potential distribution in a photodiode.

In order to further improve sensitivity of a photoelectric conversion device, it is desired to further increase the saturation charge amount of the photodiode while suppressing noise superimposed on the output signal.

SUMMARY OF THE INVENTION

The present invention intends to provide a high sensitive photoelectric conversion device including a photoelectric conversion unit that has a large saturation charge amount.

According to one aspect of the present invention, provided is a photoelectric conversion device including a photoelectric conversion unit that generates signal charge of first polarity in response to incident light, and a charge conversion circuit that converts the signal charge into signal voltage, wherein the photoelectric conversion unit includes a first semiconductor region of a first conductivity type that is provided in a surface side of a semiconductor substrate and in which carriers of the first polarity are major carriers, a second semiconductor region of a second conductivity type that is provided in the surface side of the semiconductor substrate so as to be spaced apart from the first semiconductor region and in which carriers of a second polarity that is different from the first polarity are major carriers, a third semiconductor region of the first conductivity type that is provided at a first depth that is deeper than a depth at which the second semiconductor region is provided, a fourth semiconductor region of the second conductivity type that is provided at a second depth that is deeper than a depth at which the third semiconductor region is provided and overlaps the second semiconductor region in a plan view, and a fifth semiconductor region of the first conductivity type that is provided at a third depth that is deeper than a depth at which the fourth semiconductor region is provided, and wherein the third semiconductor region and the fifth semiconductor region overlap the first semiconductor region, the second semiconductor region, and the fourth semiconductor region in the plan view.

Further features of the present invention will become apparent from the following description of exemplary embodiments with reference to the attached drawings.

BRIEF DESCRIPTION OF THE DRAWINGS

FIG. 8 is a block diagram illustrating a configuration example of an imaging system according to a third embodiment of the present invention.

DESCRIPTION OF THE EMBODIMENTS

Preferred embodiments of the present invention will now be described in detail in accordance with the accompanying drawings.

First Embodiment

Figure 1:
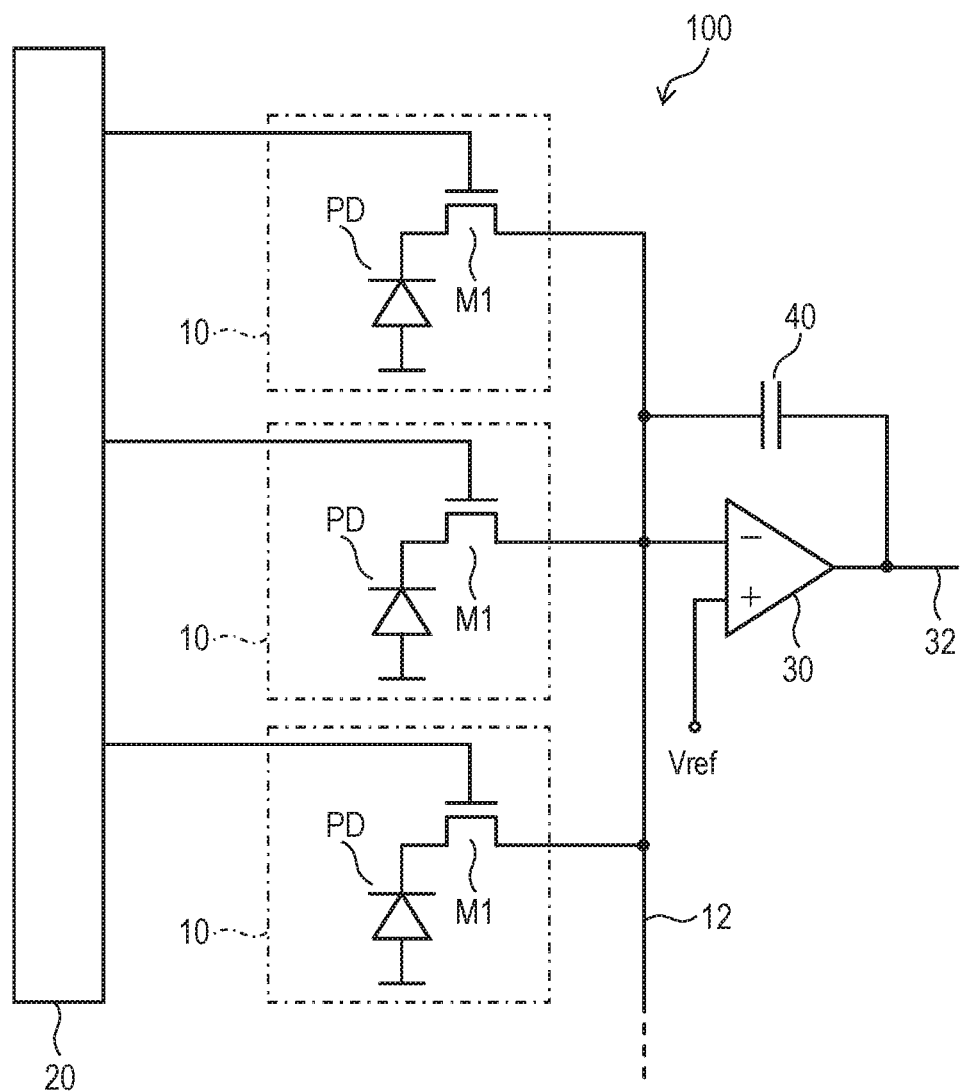
FIG. 1 is a circuit diagram illustrating a general configuration of a photoelectric conversion device according to a first embodiment of the present invention.
Figure 2:
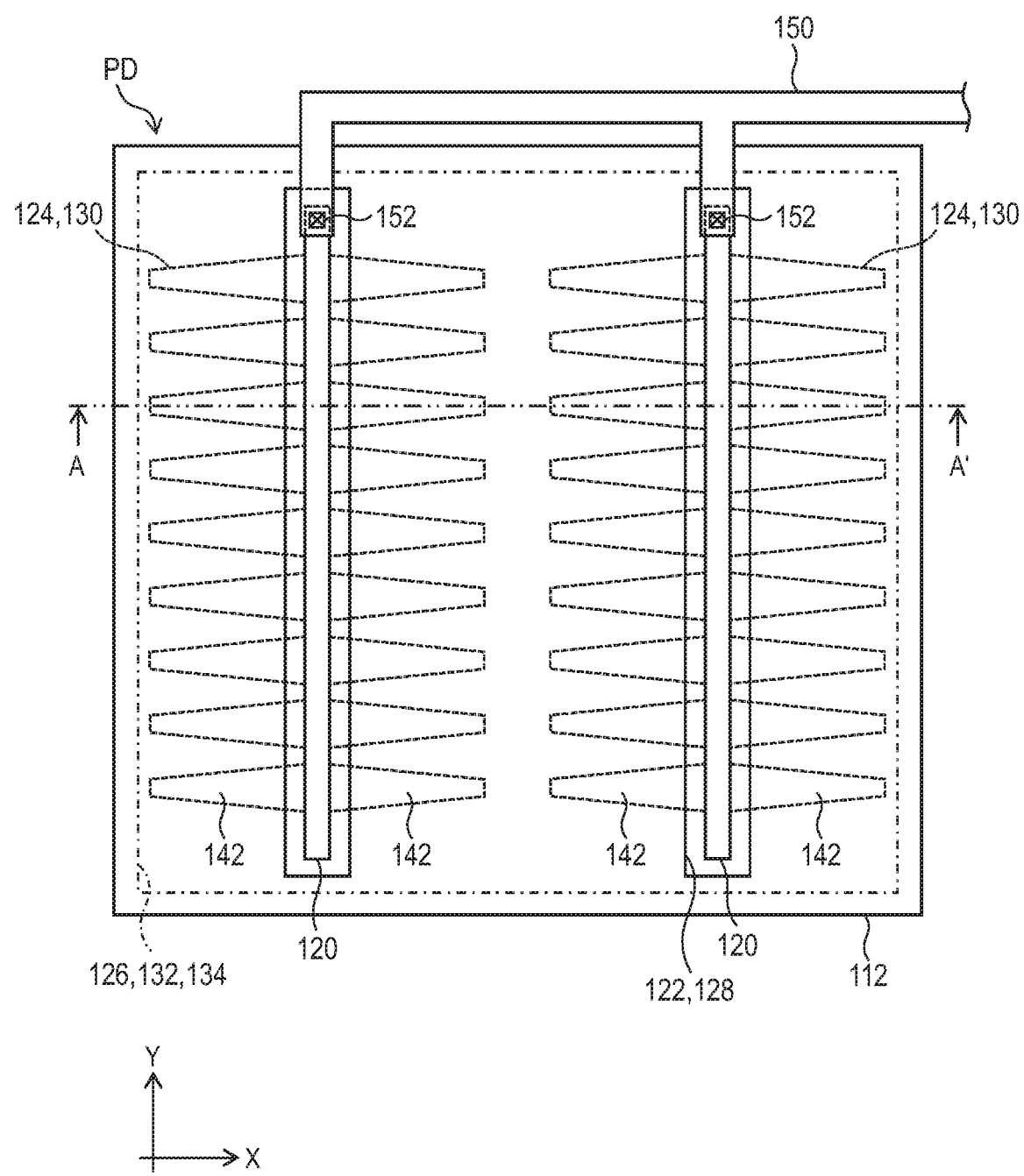
FIG. 2 is a plan view illustrating a photoelectric conversion unit of the photoelectric conversion device according to the first embodiment of the present invention.
Figure 3:
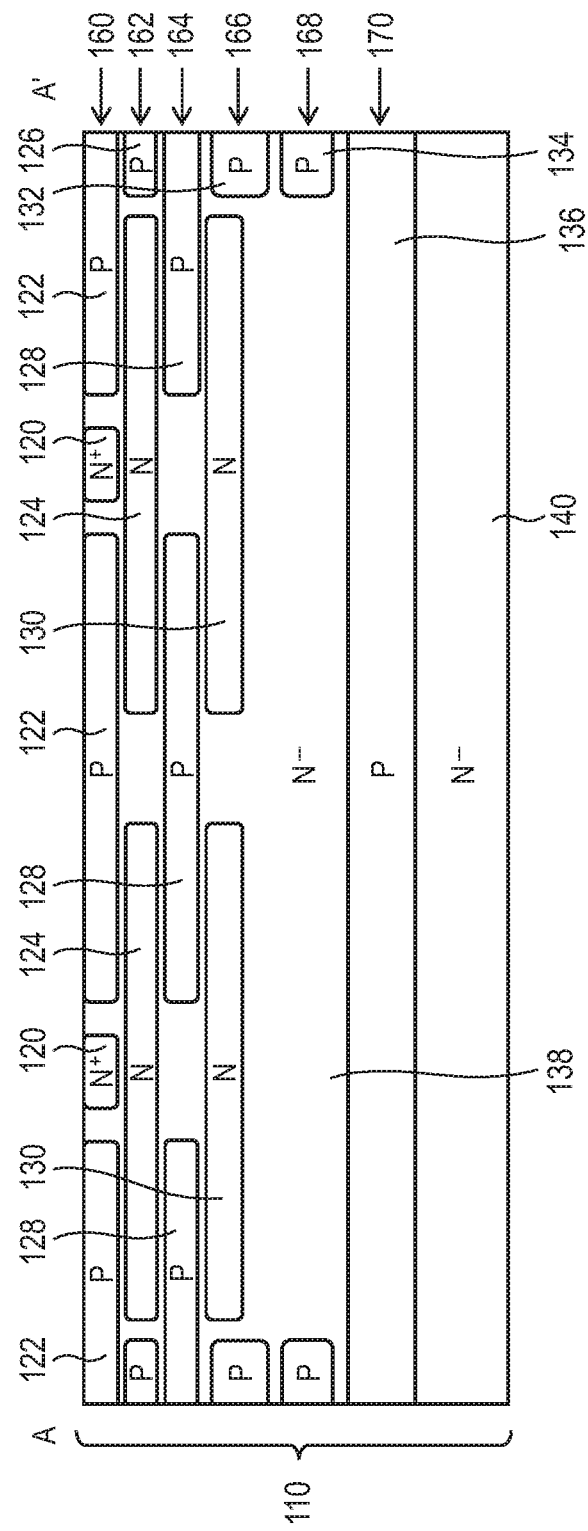
FIG. 3 is a schematic cross-sectional view illustrating the photoelectric conversion unit of the photoelectric conversion device according to the first embodiment of the present invention.
Figure 4:
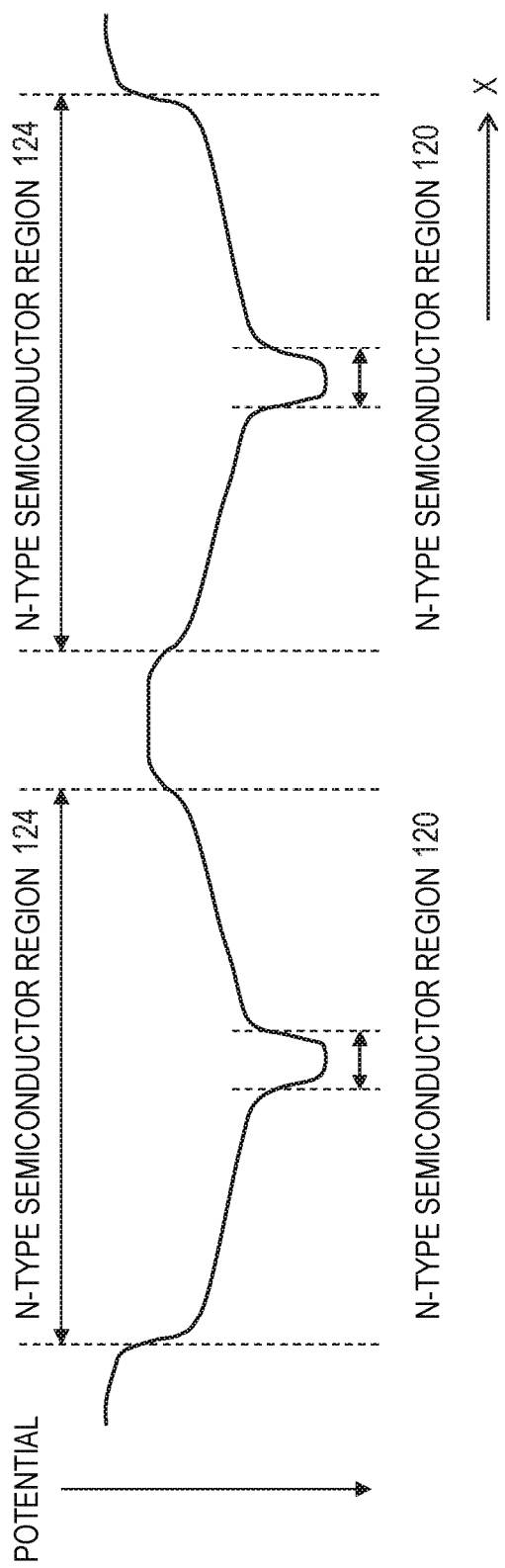
FIG. 4 is a potential diagram of the photoelectric conversion unit of the photoelectric conversion device according to the first embodiment of the present invention.

A photoelectric conversion device according to a first embodiment of the present invention will be described with reference to FIG. 1 to FIG. 4. FIG. 1 is a circuit diagram illustrating a general configuration of the photoelectric conversion device according to the present embodiment. FIG. 2 is a plan view illustrating the structure of a photoelectric conversion unit of the photoelectric conversion device according to the present embodiment. FIG. 3 is a schematic cross-sectional view illustrating the structure of the photoelectric conversion unit of the photoelectric conversion device according to the present embodiment. FIG. 4 is a potential diagram of the photoelectric conversion unit of the photoelectric conversion device according to the present embodiment.

First, the structure of the photoelectric conversion device according to the present embodiment will be described with reference to FIG. 1 to FIG. 3.

As illustrated in FIG. 1, a photoelectric conversion device 100 according to the present embodiment includes a plurality of pixels 10, a scanning circuit 20, an operational amplifier 30, and an integration capacitor 40.

Each of the plurality of pixels 10 includes a photoelectric conversion unit PD and a transfer transistor M1. The photoelectric conversion unit PD is a photodiode, for example, and has the anode connected to a ground node and the cathode connected to the source of the transfer transistor M1. The gate of the transfer transistor M1 is connected to the scanning circuit 20. The drain of the transfer transistor M1 is connected to a signal output line 12 common to the plurality of pixels 10.

The signal output line 12 is connected to the inverting input terminal (−) of the operational amplifier 30. A voltage Vref is supplied to the non-inverting input terminal (+) of the operational amplifier 30. The output terminal of the operational amplifier 30 is connected to a sensor output line 32. The integration capacitor 40 is connected between the inverting input terminal (−) and the output terminal of the operational amplifier 30.

In FIG. 1, while three pixels 10 connected to one signal output line 12 are illustrated for simplified illustration, the number of pixels 10 connected to one signal output line 12 is not particularly limited. The number of pixels 10 connected to one signal output line 12 may be less than or equal to two and may be greater than or equal to four. Further, a plurality of signal output lines 12 each of which is connected to the plurality of pixels 10 may be provided to form a two-dimensional pixel array.

The photoelectric conversion unit PD converts (photo-electrically converts) incident light into signal charge of an amount in accordance with the amount of the incident light and accumulates the generated signal charge. When turned on, the transfer transistor M1 outputs charge held by the photoelectric conversion unit PD to the signal output line 12. When readout pulses are sequentially supplied from the scanning circuit 20 to each of the pixels 10, and signal charge generated in the photoelectric conversion unit PD of each of the pixels 10 can be sequentially output to the signal output line 12.

The operational amplifier 30 and the integration capacitor 40 connected between the inverting input terminal and the output terminal thereof form a charge conversion circuit of a charge integration type. Accordingly, the signal charge output from the photoelectric conversion unit PD to the signal output line 12 are integrated on the integration capacitor 40, and the signal voltage in accordance with the amount of signal charge is output to the sensor output line 32. After signal charge is output to the signal output line 12, that is, when the photoelectric conversion unit PD is reset, the potential on the cathode side of the photoelectric conversion unit PD is set to the voltage Vref.

The integration capacitor 40 is formed of a capacitor having no potential dependency such as a MIM-type capacitor. This ensures linearity of output versus signal. As described later, a p-n junction capacitance of a photodiode that forms the photoelectric conversion unit PD has high potential dependency. However, by forming the charge integration circuit using the integration capacitor 40 having no potential dependency, an output voltage that is proportional to the amount of charge output from the photoelectric conversion unit PD can be output to the sensor output line 32 regardless of the potential dependency of a p-n junction capacitance of the photodiode. Thereby, linearity of output versus signal can be ensured.

Next, the structure of the photoelectric conversion unit PD of the photoelectric conversion device according to the present embodiment will be described with reference to FIG. 2 and FIG. 3. FIG. 2 is a plan layout diagram illustrating a configuration example of the photoelectric conversion unit PD. FIG. 3 is a cross-sectional view taken along a line A-A' of FIG. 2. Note that a plan view in this specification represents a state in which each component of the photoelectric conversion unit PD is projected onto a plane parallel to the surface of the semiconductor substrate, which corresponds to the plan layout diagram of FIG. 2.

In the present embodiment, a case where carriers with first polarity are electrons will be described as an example. In such a case, a semiconductor region in which carriers (electrons) of the first polarity are major carriers is an n-type semiconductor region, and a semiconductor region in which carriers (holes) of a second polarity that is different from the first polarity are major carriers is a p-type semiconductor region. The signal charge (electrons) generated in the photoelectric conversion unit PD is accumulated in the n-type semiconductor region. Note that the signal charge is not necessarily required to be electrons but may be holes. In such a case, a conductivity type of each region described later has the opposite conductivity type.

The photoelectric conversion unit PD of the photoelectric conversion device according to the present embodiment is a photodiode formed of a p-n junction provided in a semiconductor substrate 110. The semiconductor substrate 110 is an n-type (n⁻-type) silicon substrate with a low impurity concentration, for example. As illustrated in FIG. 3, the photoelectric conversion unit PD is provided in a photoelectric conversion unit-forming region 112 of the semiconductor substrate 110.

As illustrated in FIG. 3, an n-type n⁺-type) semiconductor region 120 and a p-type semiconductor region 122 are provided in a surface side 160 of the semiconductor substrate 110. At a first depth 162 of the semiconductor substrate 110 that is deeper than the region in which an n-type semiconductor region 120 and a p-type semiconductor region 122 are provided, an n-type semiconductor region 124 and a p-type semiconductor region 126 are provided. At a second depth 164 of the semiconductor substrate 110 that is deeper than the region in which the n-type semiconductor region 124 and the p-type semiconductor region 126 are provided, a p-type semiconductor region 128 is provided. At a third depth 166 of the semiconductor substrate 110 that is deeper than the region in which the p-type semiconductor region 128 is provided, an n-type semiconductor region 130 and a p-type semiconductor region 132 are provided. At a fourth depth 168 of the semiconductor substrate 110 that is deeper than the region in which the p-type semiconductor region 132 is provided, a p-type semiconductor region 134 is provided. At a fifth depth 170 of the semiconductor substrate 110 that is deeper than the region in which the p-type semiconductor region 134 is provided, a p-type semiconductor region 136 is provided.

The p-type semiconductor region 136 takes role of electrically isolating the n-type (n⁻-type) semiconductor region 138 that is shallower than the fifth depth 170 of the semiconductor substrate 110 from the n-type (n⁻-type) semiconductor region 140 that is deeper than the fifth depth 170 of the semiconductor substrate 110. In other words, the p-type semiconductor region 136 determines the depth at which the photoelectric conversion unit PD generates signal charge by a photoelectric conversion. The signal charge (electrons) generated in the region that is shallower than the p-type semiconductor region 136 are collected to the n-type semiconductor region 120.

As illustrated in FIG. 2, the p-type semiconductor regions 126, 132, and 134 are provided annularly along the inner circumference of the photoelectric conversion unit-forming region 112 in the plan view. In the arrangement region of the p-type semiconductor regions 126, 132, and 134 in the plan view, the p-type semiconductor regions 122, 126, 128, 132, 134, and 136 are electrically connected to each other in the depth direction. That is, together with the p-type semiconductor region 136, the p-type semiconductor regions 126, 132, and 134 take a role as an isolation layer that isolates elements from each other.

As illustrated in FIG. 2, the n-type semiconductor region 120 has an elongated rectangular pattern extending in a first direction (Y-direction in FIG. 2) parallel to the surface of the semiconductor substrate 110. The n-type semiconductor region 120 has a length close to the diameter of the photoelectric conversion unit-forming region 112 in the Y-direction. In FIG. 2, while two n-type semiconductor regions 120 are arranged in the photoelectric conversion unit-forming region 112, the number of n-type semiconductor regions 120 arranged in the photoelectric conversion unit-forming region 112 is not particularly limited and can be appropriately set in accordance with the size or the shape of the photoelectric conversion unit-forming region 112. That is, the number of n-type semiconductor regions 120 may be one or may be larger than or equal to three.

The p-type semiconductor region 122 is provided so as to be spaced apart from the n-type semiconductor region 120. More specifically, the p-type semiconductor region 122 is provided on the whole area of the photoelectric conversion unit-forming region 112 except for the n-type semiconductor region 120 and a certain range around the n-type semiconductor region 120. The p-type semiconductor region 128 is provided in the region overlapping the p-type semiconductor region 122 in the plan view.

The n-type semiconductor regions 124 and 130 are provided in association with each of two n-type semiconductor regions 120, respectively. Each of the n-type semiconductor regions 124 and 130 overlaps the corresponding n-type semiconductor region 120, the p-type semiconductor region 122, and the p-type semiconductor region 128 in the plan view. Specifically, each of the n-type semiconductor regions 124 and 130 has a trunk portion provided in the region overlapping the n-type semiconductor region 120 in the plan view and a plurality of branch portions 142 provided in the regions overlapping the p-type semiconductor regions 122 and 128 in the plan view. The plurality of branch portions 142 extend, from the trunk portion, in both directions parallel to the second direction (X-direction in FIG. 2) intersecting the first direction in the shape of teeth of a comb. The width of the branch portion 142 is narrower for a part more distant from the trunk portion. In the arrangement region of the n-type semiconductor region 120 in the plan view, the n-type semiconductor regions 120, 124, and 130 are electrically connected to each other in the depth direction.

An interconnection 150 is connected to the n-type semiconductor regions 120 via connection electrodes 152 such as a contact plug. The interconnection 150 is an interconnection that connects the cathode of the photoelectric conversion unit PD and the source of the transfer transistor M1 to each other.

In such a way, the p-n junction between the n-type semiconductor regions 120, 124, 130, and 138 and the p-type semiconductor regions 122 and 128 forms the photoelectric conversion unit PD. The n-type semiconductor regions 124 and 130 take a role as a charge accumulation layer that accumulates signal charge generated in the photoelectric conversion unit PD. In terms of reducing the contact resistance with the connection electrode 152 and the connection resistance with the n-type semiconductor regions 124 and 130, it is preferable that the n-type semiconductor region 120 have higher impurity concentration than the n-type semiconductor regions 124 and 130.

Note that, while not illustrated in FIG. 2 and FIG. 3, a fixed voltage is supplied to the p-type semiconductor region 122. Accordingly, the same voltage as the fixed voltage supplied to the p-type semiconductor region 122 is also supplied to the p-type semiconductor regions 126, 128, 132, 134, and 136 that are electrically connected to the p-type semiconductor region 122. While the fixed voltage will be described as a reference voltage (0 V) in the following description for simplified illustration, the fixed voltage is not limited to the reference voltage.

Next, the operation of the photoelectric conversion unit PD will be described with reference to FIG. 2 to FIG. 4. FIG. 4 is a potential diagram in the X-direction at the first depth 162 at which the n-type semiconductor region 124 and the p-type semiconductor region 126 are provided at the time of reset of the photoelectric conversion unit PD.

When the transfer transistor M1 is turned on, and the charge accumulated in the photoelectric conversion unit PD is then output to the signal output line 12, the potential on the cathode side of the photoelectric conversion unit PD becomes the potential in accordance with the voltage Vref, and the photoelectric conversion unit PD is reset.

The voltage Vref that is a reset voltage of the photoelectric conversion unit PD is a positive potential to the reference voltage supplied to the p-type semiconductor region 122, and a reverse bias voltage up to the voltage Vref is applied to the p-n junction portion of the photoelectric conversion unit PD at the time of reset. In such a case, the n-type semiconductor region 120 is a neutral region that has a higher impurity concentration and is less depleted. Thus, the n-type semiconductor region 120 has substantially the same voltage (voltage Vref) in any portion. On the other hand, since the n-type semiconductor regions 124 and 130 have a lower impurity concentration, the substantially whole region, in particular, a portion overlapping the p-type semiconductor regions 122 and 128 in the plan view is depleted at the time of reset. That is, a depletion voltage in the overlapping portion is smaller than the voltage Vref.

As illustrated in FIG. 4, the potential of the depleted n-type semiconductor region 124 is not flat but has a gradient. This is because the width of the branch portion 142 of the n-type semiconductor region 124 in the plan view is narrower for a part more distant from the portion (trunk portion) overlapping the n-type semiconductor region 120 in the plan view. That is, since the depletion of the n-type semiconductor region 124 proceeds not only from a face parallel to the surface of the semiconductor substrate 110 but also from a side face of the surface of the semiconductor substrate 110, the depletion voltage of the n-type semiconductor region 124 is smaller for a portion that is more distant from the trunk portion and has a narrower width of the branch portion 142. As a result, a potential gradient as illustrated in FIG. 4 is generated in the n-type semiconductor region 124.

The n-type semiconductor region 130 also has a trunk portion and the branch portions 142 that are similar to the n-type semiconductor region 124 and a potential gradient that is similar to the n-type semiconductor region 124. Note that, for the n-type semiconductor region 124 and the n-type semiconductor region 130, the impurity concentration or the like is appropriately set in the region overlapping the n-type semiconductor region 120 in the plan view so that the potential of the n-type semiconductor region 130 is shallower than the potential of the n-type semiconductor region 124.

While the p-type semiconductor region 128 may be rarely depleted, at least a part near the n-type semiconductor region 120 is depleted at the time of reset of the photoelectric conversion unit PD. The p-type semiconductor region 122 takes a role of suppressing dark current generated on the surface of the semiconductor substrate 110 and is designed to have high impurity concentration so as to be less depleted during operation of the photoelectric conversion unit PD.

With such a configuration of the photoelectric conversion unit PD, the most part of the capacitance at the time of reset of the photoelectric conversion unit PD is a p-n junction capacitance between the n-type semiconductor region 120 and the p-type semiconductor region 122. Note that the n-type semiconductor region 120 occupies only a small part of the whole area of the photoelectric conversion unit PD, and the p-n junction capacitance between the n-type semiconductor region 120 and the p-type semiconductor region 122 is significantly small.

In general, the noise at the case of charge readout is accompanied by the dominant noise at the time of reset of the photoelectric conversion unit PD, that is, so-called kTC. The kTC noise is proportional to ½ power of the capacitor at the time of reset of the photoelectric conversion unit PD. In the photoelectric conversion device according to the present embodiment, since the capacitance at the time of reset of the photoelectric conversion unit PD is small as described above, the kTC noise and therefore the noise at the time of charge readout can be suppressed.

When the transfer transistor M1 is turned off, and signal readout from the photoelectric conversion unit PD to the signal output line 12 (reset of the photoelectric conversion unit) ends, the accumulation of signal charge generated by the incident light in the photoelectric conversion unit PD is started, and the potential of the cathode of the photoelectric conversion unit PD gradually decreases.

In the present embodiment, the n-type semiconductor regions 120, 124, and 130 that form the charge accumulation layer of the photoelectric conversion unit PD, in particular, the branch portions 142 of the n-type semiconductor regions 124 and 130 are densely formed within a light receiving face of the photoelectric conversion unit PD in the plan view. Thus, signal charge generated outside the charge accumulation layer also rapidly reaches the charge accumulation layer by diffusion and are accumulated. Accordingly, for example, it is not necessary to form a potential step in a region away from the charge storage layer and to facilitate the movement of charge as disclosed in Japanese Patent Application Publication No. 2016-076647, and therefore it is possible to reduce manufacturing cost by reducing the mask process and reduce the product price.

When the amount of charge accumulated in the charge accumulation layer is small, signal charge is accumulated only in or near the n-type semiconductor region 120. When the amount of charge accumulated in the charge accumulation layer exceeds a predetermined amount, signal charge is accumulated in a portion in which the n-type semiconductor regions 124 and 130 overlap the p-type semiconductor regions 122 and 128 in a planar manner.

When the amount of charge of the charge accumulation layer reaches a saturation charge amount, signal charge is accumulated in the whole region of a portion in which the n-type semiconductor regions 124 and 130 overlap the p-type semiconductor regions 122 and 128 in a planar manner. In the capacitance of the photoelectric conversion unit PD at this time, the p-n junction capacitance between the n-type semiconductor regions 124 and 130 and the p-type semiconductor regions 122 and 128 is added to the p-n junction capacitance between the n-type semiconductor region 120 and the p-type semiconductor regions 122. Since the n-type semiconductor regions 124 and 130 and the p-type semiconductor regions 122 and 128 are close to each other as illustrated in FIG. 3, the capacitance per unit area is large. Further, since the n-type semiconductor region 120 has a length that is close to the diameter of the photoelectric conversion unit PD, and the n-type semiconductor regions 124 and 130 are connected to the n-type semiconductor region 120 and formed inside the semiconductor substrate 110, a large p-n junction area can be secured. In addition, the charge accumulation layer has a two-stack structure formed of the n-type semiconductor regions 124 and 130 in the depth direction. Accordingly, the capacitance of the photoelectric conversion unit PD at the time of saturation is much larger than the capacitor of the photoelectric conversion unit PD at the time of reset, and a sufficient amount of saturation signal can be obtained.

The signal readout from the photoelectric conversion unit PD is performed by turning on the transfer transistor M1. When the transfer transistor M1 is in an on-state, the potential of the n-type semiconductor region 120 becomes closer to the voltage Vref through the signal output line 12. In addition, the signal charge accumulated in the charge accumulation layer flows out in the direction of the n-type semiconductor region 120.

At this time, since the n-type semiconductor region 120 includes a neutral region and has a low resistance, a signal readout rate from the photoelectric conversion unit PD is mainly due to a readout rate of signal charge accumulated in the n-type semiconductor regions 124 and 130. In the present embodiment, however, the signal charge in the n-type semiconductor regions 124 and 130 distant from the n-type semiconductor region 120 can also be rapidly read out due to a drift motion caused by the potential gradient illustrated in FIG. 4. Further, as illustrated in FIG. 2, the n-type semiconductor regions 124 and 130 have a length that is only around one quarter of the diameter of the photoelectric conversion unit PD. Accordingly, with the configuration of the present embodiment, a signal readout rate from the photoelectric conversion unit PD can be improved.

Figure 5:
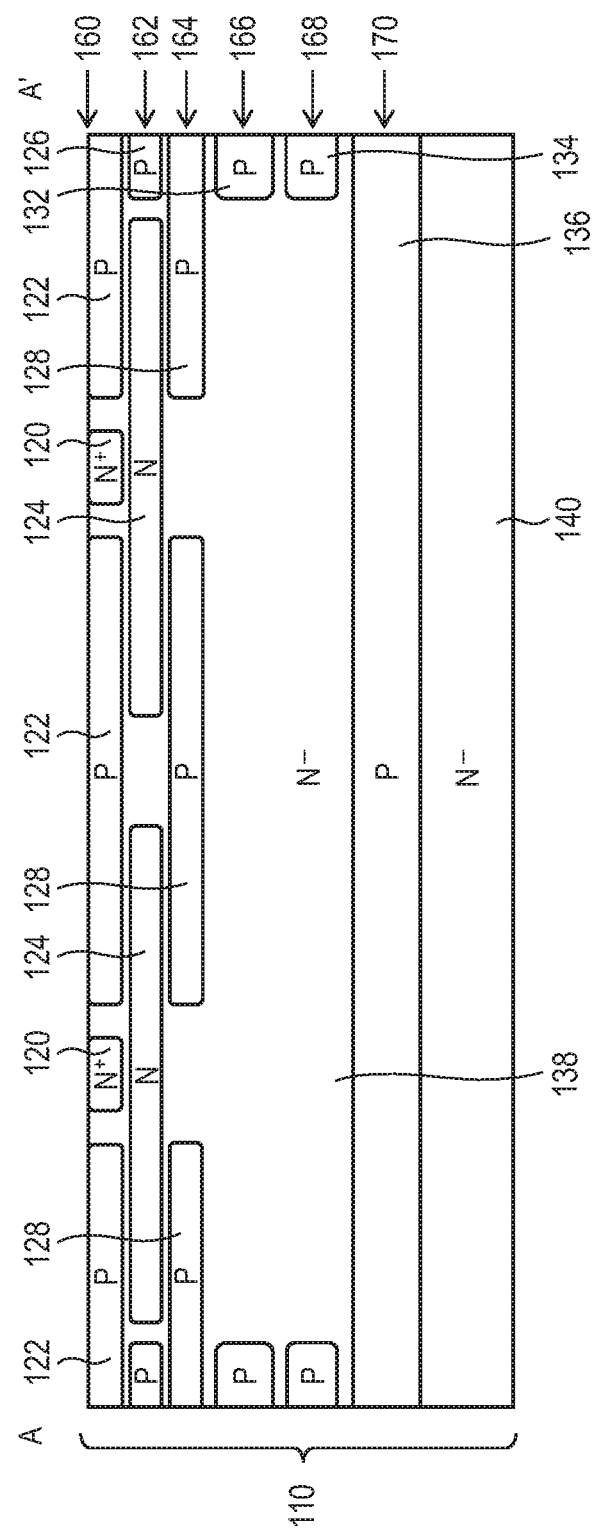
FIG. 5 is a schematic cross-sectional view illustrating a photoelectric conversion unit of a photoelectric conversion device according to a modified example of the first embodiment of the present invention.

FIG. 5 is a schematic cross-sectional view illustrating the structure of the photoelectric conversion unit of the photoelectric conversion device according to a modified example of the present embodiment. In the structure illustrated in FIG. 5, the n-type semiconductor region 130 in FIG. 3 is not provided, and the n-type semiconductor region 138 is provided under the p-type semiconductor region 128.

In FIG. 5, the n-type semiconductor region 138 is an n-type semiconductor layer having an impurity concentration that is lower than that of the n-type semiconductor region 124. Typically, the n-type semiconductor region 138 has the same impurity concentration as the n-type semiconductor region 140. Accordingly, in the n-type semiconductor region 138, the signal charge is less likely to be accumulated than the n-type semiconductor region 124, and the n-type semiconductor region 138 is easily depleted. Accordingly, the p-n junction capacitance of the portion of the n-type semiconductor region 138 is smaller than the p-n junction capacitance of the portion of the n-type semiconductor region 130 in FIG. 3. On the other hand, in the form in FIG. 5, the p-n junction capacitance of the photoelectric conversion unit PD can be reduced compared to the case where the n-type semiconductor region 130 is provided under the p-type semiconductor region 128 as with the form in FIG. 3. Therefore, while the saturation signal amount of the photoelectric conversion unit PD decreases, noise can be further reduced.

As described above, according to the present embodiment, a high sensitive photoelectric conversion device including a photoelectric conversion unit that has small noise and a large saturation charge amount can be realized.

Second Embodiment

Figure 6:
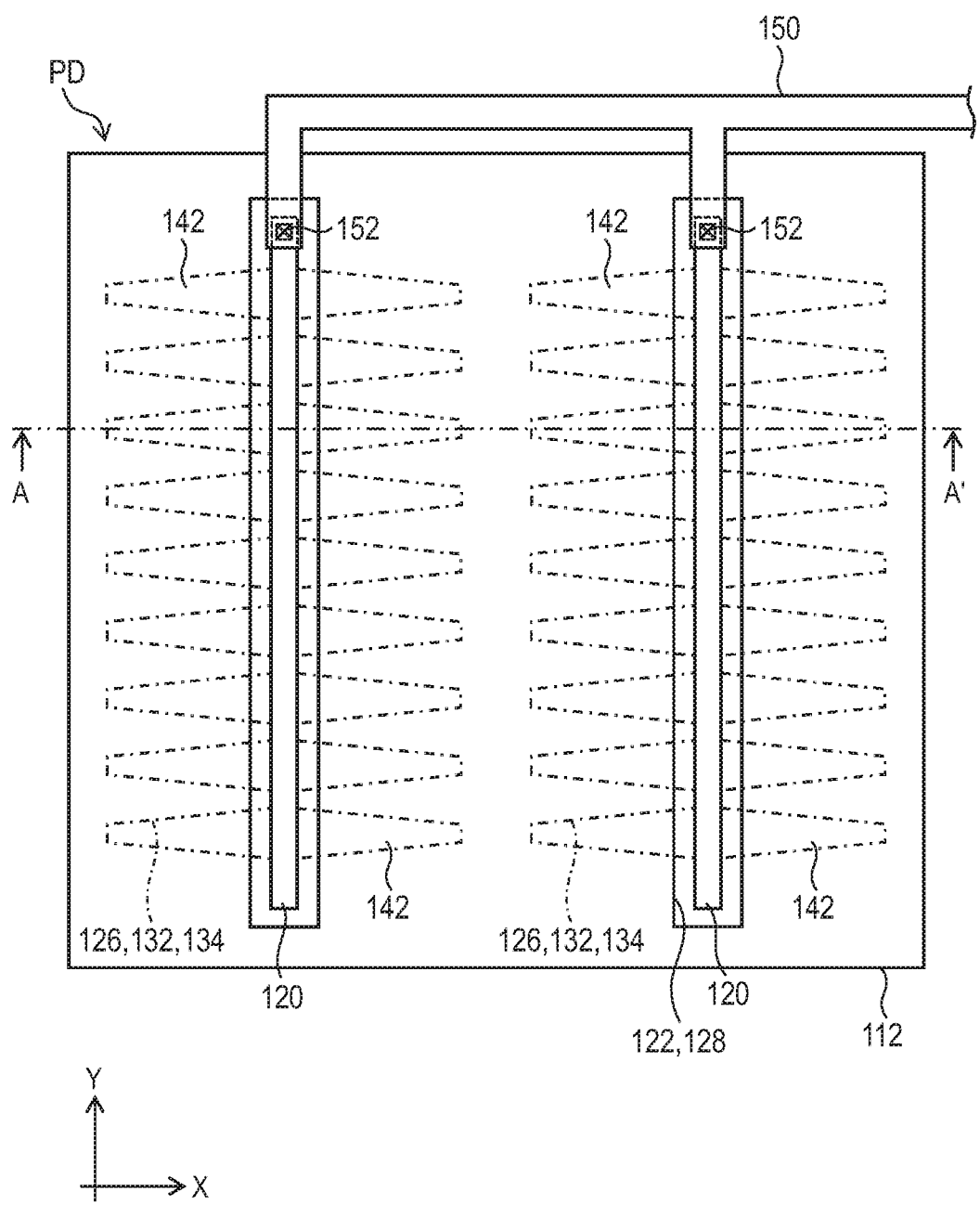
FIG. 6 is a plan view illustrating a photoelectric conversion unit of a photoelectric conversion device according to a second embodiment of the present invention.
Figure 7:
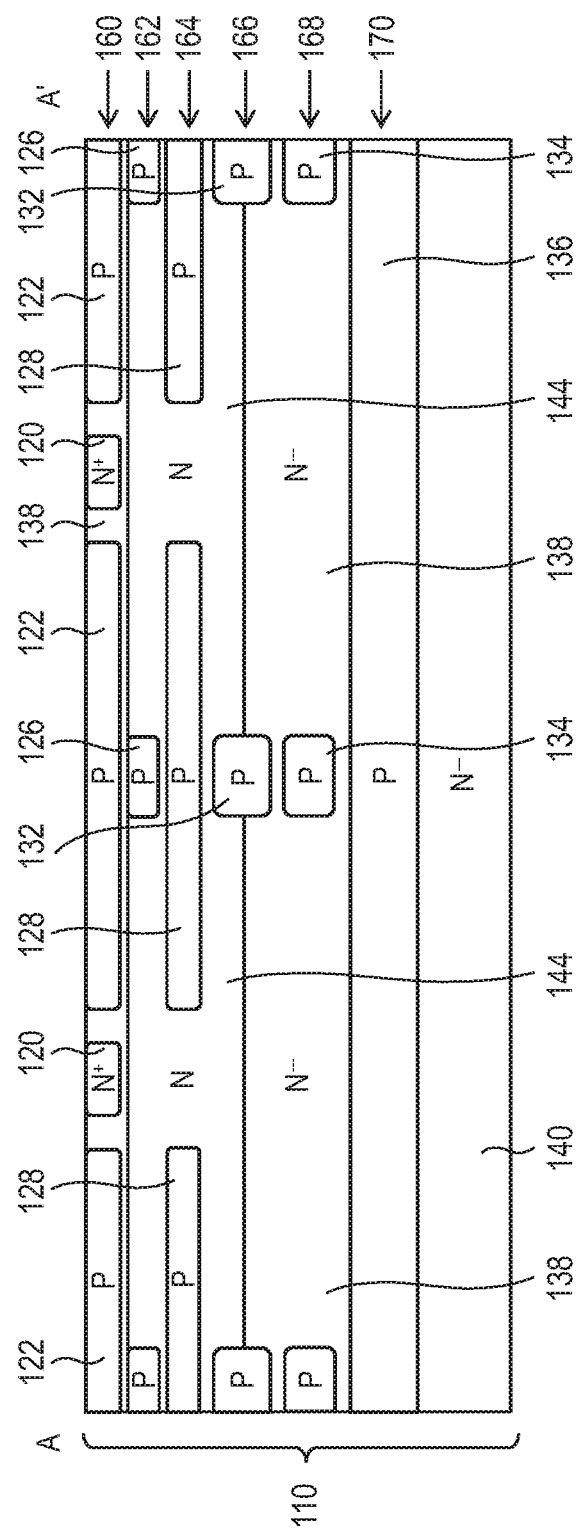
FIG. 7 is a schematic cross-sectional view illustrating the photoelectric conversion unit of the photoelectric conversion device according to the second embodiment of the present invention.

A photoelectric conversion device according to a second embodiment of the present invention will be described with reference to FIG. 6 and FIG. 7. FIG. 6 is a plan view illustrating the structure of a photoelectric conversion unit of a photoelectric conversion device according to the present embodiment. FIG. 7 is a schematic cross-sectional view illustrating the structure of the photoelectric conversion unit of the photoelectric conversion device according to the present embodiment. The same components as those of the photoelectric conversion device according to the first embodiment are labeled with the same references, and the description thereof will be omitted or simplified.

The photoelectric conversion device according to the present embodiment is the same as the photoelectric conversion device according to the first embodiment except for a difference in the structure of the photoelectric conversion unit PD. The photoelectric conversion unit PD of the photoelectric conversion device according to the present embodiment is different from that of the first embodiment in that an n-type semiconductor region 144 is provided instead of the n-type semiconductor regions 124 and 130, and the layout of the p-type semiconductor regions 126, 132, and 134 are different in a plan view.

That is, as illustrated in FIG. 7, the photoelectric conversion unit PD of the photoelectric conversion device according to the present embodiment has the n-type semiconductor region 144 provided in the region from the first depth 162 to the third depth 166 of the semiconductor substrate 110 instead of the n-type semiconductor regions 124 and 130. The n-type semiconductor region 144 has, at the first depth 162 and at the third depth 166, the same plan layout as the n-type semiconductor regions 124 and 130 in the first embodiment. That is, the n-type semiconductor region 144 has, at the first depth 162 and at the third depth 166, the plurality of branch portions 142 extending to both directions parallel to the second direction (X-direction in FIG. 6) from the region overlapping the n-type semiconductor region 120 in the plan view in a shape of teeth of a comb. The branch portions 142 each have a tapered shape whose width becomes wider as it is closer to the region overlapping the n-type semiconductor region 120.

Note that the third depth 166 is not necessarily required to be deeper than the deepest part of the p-type semiconductor region 128 in the present embodiment. The third depth 166 is variable based on the saturation charge amount required to the photoelectric conversion unit PD.

At the first depth 162, the outer edge of the n-type semiconductor region 144 in the plan view is defined by the junction with the p-type semiconductor region 126. At the second depth 164, the outer edge of the n-type semiconductor region 144 in the plan view is defined by the junction with the p-type semiconductor region 128. At the third depth 166, the outer edge of the n-type semiconductor region 144 in the plan view is defined by the junction with the p-type semiconductor region 132. Note that, in FIG. 6, while the layouts of the p-type semiconductor regions 126, 132, and 134 in the plan view are the same, the layout of the p-type semiconductor region 134 may be the same as the case of the first embodiment.

Note that, in FIG. 6, the p-type semiconductor regions 126, 132, and 134 are formed outside dashed-dotted lines represented by the p-type semiconductor regions 126, 132, and 134. This is different from the case where the regions 126, 132 and 134 locate only the narrow path along the border of the PD unit region 112, and the n-type semiconductor regions 124 and 130 are formed inside a dotted line represented by the n-type semiconductor regions 124 and 130 in FIG. 2.

An n-type impurity used for forming the n-type semiconductor region 144 can be introduced to the whole photoelectric conversion unit-forming region 112 in the plan view as with a p-type impurity used for forming the p-type semiconductor region 136. In such a case, the concentration of the n-type impurity forming the n-type semiconductor region 144 is set to be lower than the concentration of the p-type impurity forming the p-type semiconductor regions 126, 128, and 132. With such a configuration, the region other than the region where the p-type semiconductor regions 126, 128, and 132 are formed is the n-type semiconductor region 144.

Also in the present embodiment, as with the cased of the first embodiment, when the photoelectric conversion unit PD is in a reset state, the n-type semiconductor region 144 is depleted in the most region overlapping the p-type semiconductor regions 122 and 128 in the plan view. The potential gradient is then formed in the n-type semiconductor region 144 in both the plane direction and the depth direction so that the potential is deeper for a part closer to the n-type semiconductor region 120. That is, the photoelectric conversion unit PD according to the present embodiment is the same as that of the first embodiment in that the capacitance at the time of reset is small, that is, noise is small, and a large amount of saturation signal can be ensured.

In addition, in the photoelectric conversion unit PD according to the present embodiment, a signal readout rate can be improved compared to the photoelectric conversion unit PD of the first embodiment, as described below.

When the signal charge is read out, holes in the p-type semiconductor regions 122, 128, and 136 move as signal charge (electrons in the present embodiment) in the charge accumulation layer move. In general, when a voltage between the two electrodes forming a capacitor changes, charges accumulated in both the electrodes move by the same amount. Herein, the p-type semiconductor region 122 has a high concentration and a low resistance in general. On the other hand, since a higher concentration of the p-type semiconductor region 128 makes it difficult to form the n-type semiconductor region 144, high concentration of the p-type semiconductor region 128 is to be avoided. Further, while the p-type semiconductor region 136 is formed at a deep region using high-energy ion implantation, it is difficult to increase the amount of high-energy ion implantation in general. Thus, the p-type semiconductor regions 128 and 136 have relatively a low concentration and a high resistance compared to the p-type semiconductor region 122. Thus, in the first embodiment, the moving speed of holes in the p-type semiconductor regions 128 and 136 is not necessarily sufficient, which causes a reduction in the signal readout rate.

On the other hand, in the present embodiment, as illustrated in FIG. 6 and FIG. 7, the p-type semiconductor region 128 is electrically conducted to the p-type semiconductor regions 126 and 132 in the most region of the photoelectric conversion unit-forming region 112. Further, the p-type semiconductor region 136 is electrically conducted to the p-type semiconductor region 134 in the most region of the photoelectric conversion unit-forming region 112. Accordingly, holes in the p-type semiconductor region 128 rapidly move to the p-type semiconductor region 122 via the p-type semiconductor region 126 and are drained from the p-type semiconductor region 122. Further, holes in the p-type semiconductor region 136 rapidly move to the p-type semiconductor region 122 via the p-type semiconductor regions 134, 132, and 126 and are drained from the p-type semiconductor region 122.

Therefore, in the photoelectric conversion unit PD of the present embodiment, the signal readout rate can be improved compared to the case of the first embodiment.

Further, in the photoelectric conversion unit PD of the present embodiment, as described below, it is possible to reduce the mask process during manufacturing compared to the case of the photoelectric conversion unit PD of the first embodiment, and it is thus possible to reduce manufacturing cost and therefore reduce the price of a photoelectric conversion device.

That is, in the photoelectric conversion unit PD of the first embodiment, as illustrated in FIG. 2 and FIG. 3, the n-type semiconductor regions 124 and 130 and the p-type semiconductor region 136 have different plan layouts. That is, for manufacturing the photoelectric conversion unit PD, the mask process for forming the n-type semiconductor regions 124 and 130 and the mask process for forming the p-type semiconductor region 136 are required, respectively.

On the other hand, in the photoelectric conversion unit PD of the present embodiment, as described above, the n-type impurity forming the n-type semiconductor region 144 can be introduced throughout the photoelectric conversion unit-forming region 112 in the plan view. That is, the same mask can be used as the mask used for forming the n-type semiconductor region 144 and the mask used for forming the p-type semiconductor region 136. Accordingly, in manufacturing the photoelectric conversion unit PD, the n-type semiconductor region 144 and the p-type semiconductor region 136 can be formed by a single mask process, and one mask process can be reduced compared to the case of the first embodiment.

Therefore, in the present embodiment, it is possible to reduce manufacturing cost compared to the case of the first embodiment and therefore reduce the price of a photoelectric conversion device.

As described above, according to the present embodiment, a high sensitive photoelectric conversion device including a photoelectric conversion unit that has less noise and a large saturation charge amount can be realized.

Third Embodiment

An imaging system according to a third embodiment of the present invention will be described with reference to FIG. 8. FIG. 8 is a block diagram illustrating a general configuration of the imaging system according to the present embodiment.

The photoelectric conversion device 100 described in the first and second embodiments described above can be applied to various imaging systems. Examples of applicable imaging systems may include a digital still camera, a digital camcorder, a surveillance camera, a copying machine, a fax machine, a mobile phone, an on-vehicle camera, an observation satellite, and the like. In addition, a camera module including an optical system such as a lens and an imaging device is also included in the imaging system. FIG. 8 illustrates a block diagram of a digital still camera as an example out of these examples.

An imaging system 200 illustrated as an example in FIG. 8 includes an imaging device 201, a lens 202 that captures an optical image of an object onto the imaging device 201, an aperture 204 for changing a light amount passing through the lens 202, and a barrier 206 for protecting the lens 202. The lens 202 and the aperture 204 form an optical system that converges a light onto the imaging device 201. The imaging device 201 is the photoelectric conversion device 100 described in any of the first and second embodiments and converts an optical image captured by the lens 202 into image data.

Further, the imaging system 200 includes a signal processing unit 208 that processes an output signal output from the imaging device 201. The signal processing unit 208 preforms analog-to-digital (AD) conversion that converts an analog signal output from the imaging device 201 into a digital signal. In addition, the signal processing unit 208 performs operations of performing various correction or compression to output image data, if necessary. The AD conversion unit that is a part of the signal processing unit 208 may be formed on a semiconductor substrate on which the imaging device 201 is provided or formed on a semiconductor substrate separately from the imaging device 201. Further, the imaging device 201 and the signal processing unit 208 may be formed on the same semiconductor substrate.

Furthermore, the imaging system 200 includes a memory unit 210 for temporarily storing image data therein and an external interface unit (external IF unit) 212 for communicating with an external computer or the like. The imaging system 200 further includes a storage medium 214 such as a semiconductor memory for performing storage or readout of imaging data and a storage medium control interface unit (storage medium control I/F unit) 216 for performing storage or readout on the storage medium 214. Note that the storage medium 214 may be embedded in the imaging system 200 or may be removable.

Furthermore, the imaging system 200 includes a general control/operation unit 218 that performs various calculation and controls the entire digital still camera and a timing generation unit 220 that outputs various timing signals to the imaging device 201 and the signal processing unit 208. Here, the timing signal or the like may be input from the outside, and the imaging system 200 may include at least the imaging device 201 and the signal processing unit 208 that processes an output signal output from the imaging device 201.

The imaging device 201 outputs an imaging signal to the signal processing unit 208. The signal processing unit 208 performs predetermined signal processing on an imaging signal output from the imaging device 201 and outputs image data. The signal processing unit 208 uses an imaging signal to generate an image.

As described above, according to the present embodiment, the imaging system to which the photoelectric conversion device 100 according to the first and second embodiment is applied can be realized.

Fourth Embodiment

Figure 9A:
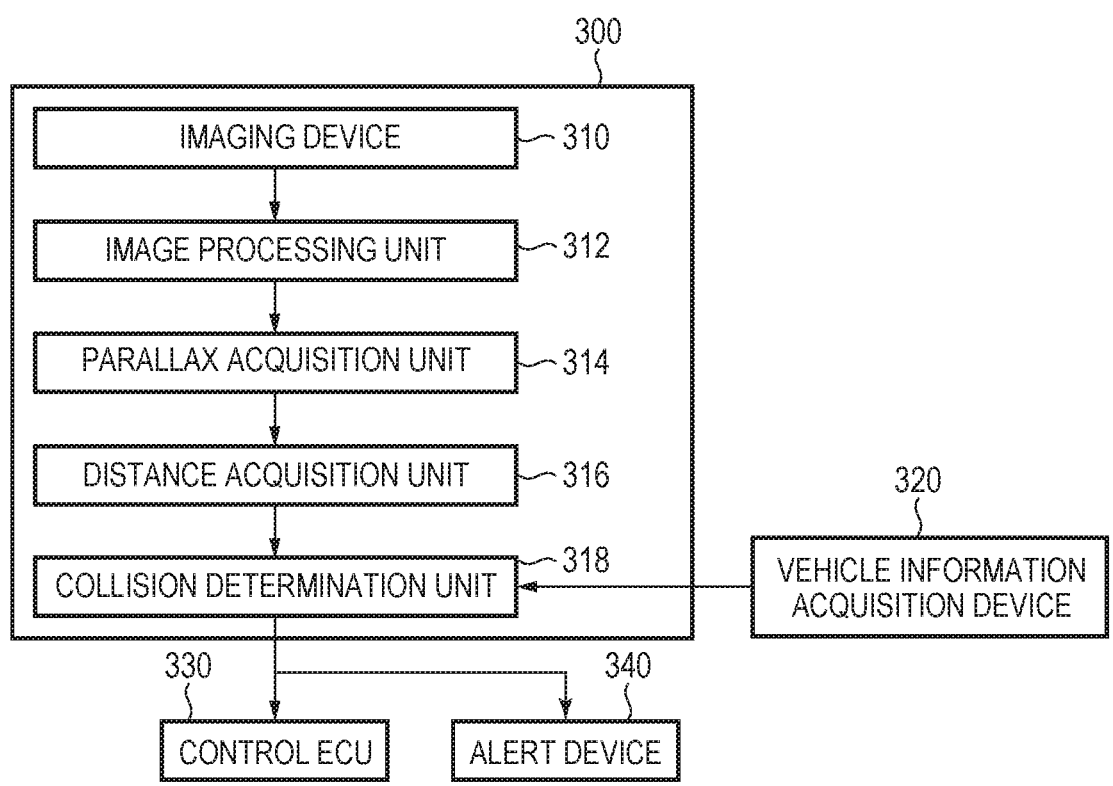
FIG. 9A is a diagram illustrating a configuration example of an imaging system according to a fourth embodiment of the present invention.
Figure 9B:
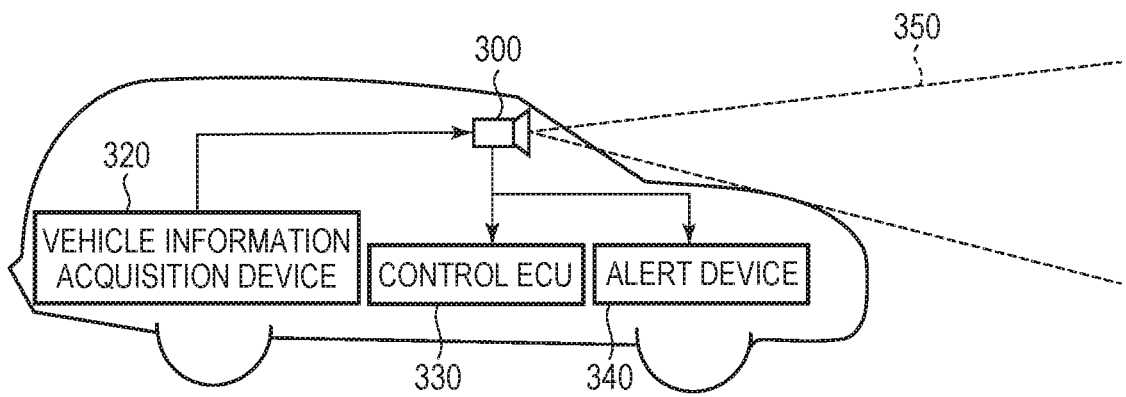
FIG. 9B is a diagram illustrating a configuration example of a movable object according to the fourth embodiment of the present invention.

An imaging system and a movable object according to a fourth embodiment of the present invention will be described with reference to FIG. 9A and FIG. 9B. FIG. 9A is a diagram illustrating a configuration of the imaging system according to the present embodiment. FIG. 9B is a diagram illustrating a configuration of the movable object according to the present embodiment.

FIG. 9A illustrates an example of an imaging system related to an on-vehicle camera. An imaging system 300 includes an imaging device 310. The imaging device 310 is the photoelectric conversion device 100 described in any of the above first and second embodiments. The imaging system 300 includes an image processing unit 312 that performs image processing on a plurality of image data acquired by the imaging device 310 and a parallax acquisition unit 314 that calculates a parallax (a phase difference of parallax images) from the plurality of image data acquired by the imaging system 300. Further, the imaging system 300 includes a distance acquisition unit 316 that calculates a distance to the object based on the calculated parallax and a collision determination unit 318 that determines whether or not there is a collision possibility based on the calculated distance. Here, the parallax acquisition unit 314 and the distance acquisition unit 316 are an example of a distance information acquisition unit that acquires distance information on the distance to the object. That is, the distance information is information on a parallax, a defocus amount, a distance to an object, or the like. The collision determination unit 318 may use any of the distance information to determine the collision possibility. The distance information acquisition unit may be implemented by dedicatedly designed hardware or may be implemented by a software module. Further, the distance information acquisition unit may be implemented by a Field Programmable Gate Array (FPGA), an Application Specific Integrated Circuit (ASIC), or the like or may be implemented by a combination thereof.

The imaging system 300 is connected to the vehicle information acquisition device 320 and can acquire vehicle information such as a vehicle speed, a yaw rate, a steering angle, or the like. Further, the imaging system 300 is connected to a control ECU 330, which is a control device that outputs a control signal for causing a vehicle to generate braking force based on a determination result by the collision determination unit 318. Further, the imaging system 300 is also connected to an alert device 340 that issues an alert to the driver based on a determination result by the collision determination unit 318. For example, when the collision probability is high as the determination result of the collision determination unit 318, the control ECU 330 performs vehicle control to avoid a collision or reduce damage by applying a brake, pushing back an accelerator, suppressing engine power, or the like. The alert device 340 alerts a user by sounding an alert such as a sound, displaying alert information on a display of a car navigation system or the like, providing vibration to a seat belt or a steering wheel, or the like.

In the present embodiment, an area around a vehicle, for example, a front area or a rear area is captured by using the imaging system 300. FIG. 9B illustrates the imaging system when a front area of a vehicle (a capturing area 350) is captured. The vehicle information acquisition device 320 transmits an instruction to the imaging system 300 or the imaging device 310. Such a configuration can further improve the ranging accuracy.

Although the example of control for avoiding a collision to another vehicle has been described above, the embodiment is applicable to automatic driving control for following another vehicle, automatic driving control for not going out of a traffic lane, or the like. Furthermore, the imaging system is not limited to a vehicle such as the subject vehicle and can be applied to a movable object (moving apparatus) such as a ship, an airplane, or an industrial robot, for example. In addition, the imaging system can be widely applied to a device which utilizes object recognition, such as an intelligent transportation system (ITS), without being limited to movable objects.

Fifth Embodiment

Figure 10:
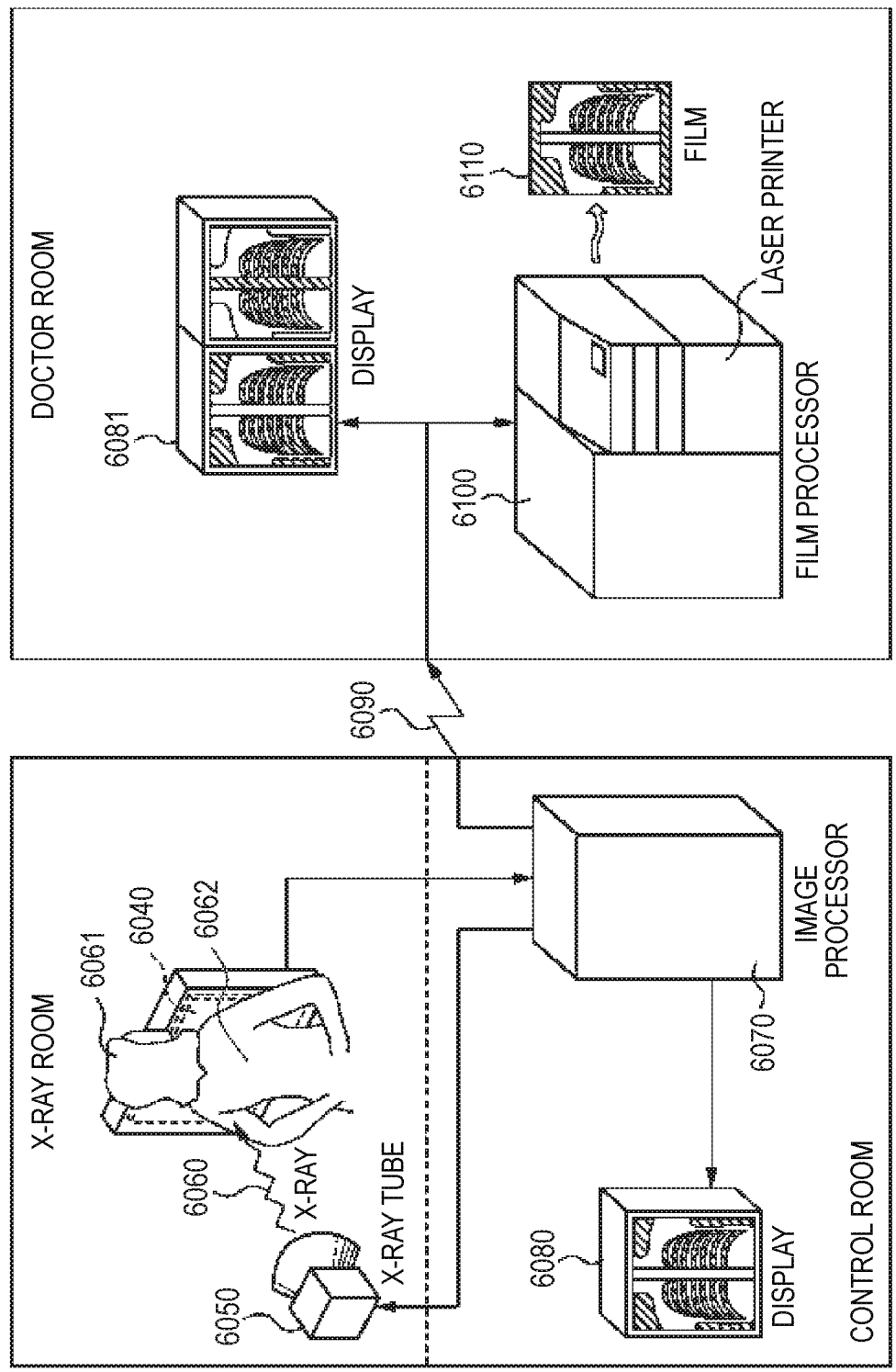
FIG. 10 is a diagram illustrating a radioactive ray imaging system according to a fifth embodiment of the present invention.

A radioactive ray imaging system according to a fifth embodiment of the present invention will be described with reference to FIG. 10. FIG. 10 is a diagram illustrating the radioactive ray imaging system according to the present embodiment. In the present embodiment, an example in which the photoelectric conversion devices described in the first and second embodiments are applied to the radioactive ray imaging system will be described.

As illustrated in FIG. 10, the radioactive ray imaging system according to the present embodiment includes a radioactive ray imaging device 6040 and an image processor 6070 that processes a signal output from the radioactive ray imaging device 6040. The radioactive ray imaging device 6040 is a device in which the photoelectric conversion device described in the each of the above embodiments is configured as a device capturing a radioactive ray. An X-ray 6060 generated in an X-ray tube (source of radioactive rays) 6050 transmits through the chest 6062 of a patient or an object 6061 and enters the radioactive ray imaging device 6040. The incident X-ray includes information on the inside of the body of the object 6061. The radioactive ray imaging device 6040 includes a scintillator that converts the wavelength of the incident X-ray. The scintillator typically converts the X-ray to the light having the longer wavelength including visible light, and multiplies the number of photons. The radioactive ray imaging device 6040 includes the photoelectric conversion device described in the above embodiments, and the light whose wavelength has been converted by the scintillator enters the photoelectric conversion device. Accordingly, in the photoelectric conversion device 100 described in the each of the above embodiments, the n-type semiconductor region 120 collects signal charge corresponding to the incident light converted at the scintillator.

An image processor (processor) 6070 can process a signal (image) output from the radioactive ray imaging device 6040 and cause a display 6080 in a control room to display an image based on the image signal obtained by the process, for example.

Further, the image processor 6070 can transfer the signal obtained by the process to a remote location via a transmission path 6090. Thereby, the image processor 6070 can cause a display 6081 arranged in a doctor room or the like at another place to display an image and cause a storage medium such as an optical disk to store the image. The storage medium may be a film 6110, and in such a case, a film processor 6100 stores an image in the film 6110.

Note that the photoelectric conversion device described in this specification can also be applied to an imaging system that captures an image through the light. Such an imaging system may have a photoelectric conversion device and a processor that processes a signal output from the photoelectric conversion device, for example. The process by the processor may include at least one of a process of converting a format of an image, a process of compressing an image, a process of changing the size of an image, and a process of changing the contrast of an image, for example.

Modified Embodiment

The present invention is not limited to the embodiments described above, and various modifications are possible.

For example, an example in which a part of the configuration of any of the embodiments is added to another embodiment or an example in which a part of the configuration of any of the embodiments is replaced with a part of the configuration of another embodiment is also one of the embodiments of the present invention.

Further, in the first and the second embodiments described above, the charge accumulation layer formed of the n-type semiconductor regions 120, 124, and 130 is divided into two blocks whose center is at each of the two n-type semiconductor regions 120, and these blocks are connected to each other by the interconnection 150. However, the charge accumulation layer is not necessarily required to be divided or may be divided to three or more blocks. The number of blocks forming the charge accumulation layer can be appropriately selected in accordance with the size, the shape, or the like of the photoelectric conversion unit-forming region 112.

Further, when the charge accumulation layer is divided into a plurality of blocks, an isolation portion formed of the p-type semiconductor regions 126, 132, and 134 may be arranged between respective blocks. With such a configuration, the p-type semiconductor regions 128 and 136 can have a lower resistant, and the signal readout rate can be improved.

Further, in the first and second embodiments described above, while the branch portions 142 of the charge accumulation layer are arranged in two stacks in the depth direction, the branch portions 142 are not necessarily required to be arranged in a plurality of stacks, or the number of stacks may be three or greater in the depth direction.

Further, when the branch portions 142 of the charge accumulation layer are arranged in a plurality of stacks, some of the stacks may have the same configuration as that of the first embodiment, and the other may have the same configuration as that of the second embodiment. Further, when the branch portions 142 of the charge accumulation layer are formed in a plurality of stacks, the plan layout of the branch portions 142 forming each stack may be the same or may be different.

Further, in the first and second embodiments described above, while the width of the branch portions 142 in the plan view changes continuously, the width of the branch portions 142 is not necessarily required to change continuously. The width of the branch portions 142 in the plan view may be any width as long as it is wider for a part closer to the region overlapping the n-type semiconductor region 120 or may change stepwise.

Further, the imaging systems illustrated in the above third to fifth embodiments are examples of an imaging system to which the photoelectric conversion device of the present invention may be applied, and an imaging system to which the photoelectric conversion device of the present invention can be applied is not limited to the configuration illustrated in FIG. 8 to FIG. 10.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-033868, filed Feb. 27, 2019 and Japanese Patent Application No. 2019-145109, filed Aug. 7, 2019 which are hereby incorporated by reference herein in their entirety.

What is claimed is:

1. A photoelectric conversion device comprising:
a photoelectric conversion unit that generates a signal charge of a first polarity in response to incident light; and
a charge conversion circuit that converts the signal charge of the first polarity into a signal voltage,
wherein the photoelectric conversion unit includes:
a first semiconductor region of a first conductivity type that is provided in a surface side of a semiconductor substrate and in which carriers of the first polarity are major carriers,
a second semiconductor region of a second conductivity type that is provided in the surface side of the semiconductor substrate so as to be spaced apart from the first semiconductor region and in which carriers of a second polarity that is different from the first polarity are major carriers,
a third semiconductor region of the first conductivity type that is provided at a first depth that is deeper than a depth at which the second semiconductor region is provided,
a fourth semiconductor region of the second conductivity type that is provided at a second depth that is deeper than a depth at which the third semiconductor region is provided and overlaps the second semiconductor region in a plan view, and
a fifth semiconductor region of the first conductivity type that is provided at a third depth that is deeper than a depth at which the fourth semiconductor region is provided,
wherein the third semiconductor region and the fifth semiconductor region overlap the first semiconductor region, the second semiconductor region, and the fourth semiconductor region in the plan view, and
wherein the third semiconductor region has a first portion overlapping the first semiconductor region in the plan view and a plurality of second portions extending from the first portion and overlapping the second semiconductor region and the fourth semiconductor region in the plan view.

2. The photoelectric conversion device according to claim 1, wherein impurity concentrations of the third semiconductor region and the fifth semiconductor region are lower than an impurity concentration of the first semiconductor region.

3. The photoelectric conversion device according to claim 1, wherein a portion in which the third semiconductor region and the fifth semiconductor region overlap the second semiconductor region and the fourth semiconductor region in the plan view is depleted when the photoelectric conversion unit is reset.

4. The photoelectric conversion device according to claim 1, wherein the photoelectric conversion unit further includes:
a sixth semiconductor region of the second conductivity type provided at the first depth; and
a seventh semiconductor region of the second conductivity type provided at the third depth,
wherein an outer edge of the third semiconductor region in the plan view is defined by a junction between the third semiconductor region and the sixth semiconductor region, and
wherein an outer edge of the fifth semiconductor region in the plan view is defined by a junction between the fifth semiconductor region and the seventh semiconductor region.

5. The photoelectric conversion device according to claim 4, wherein the sixth semiconductor region and the seventh semiconductor region form an isolation layer that isolates elements from each other.

6. The photoelectric conversion device according to claim 1, wherein the first portion has a trunk shape in the plan view and each of the plurality of second portions has a branch shape extending from the first portion in the plan view.

7. The photoelectric conversion device according to claim 1, wherein a width of the second portion in the plan view is narrower for a part more distant from the first portion.

8. The photoelectric conversion device according to claim 1,
wherein the first semiconductor region has a rectangular pattern extending in a first direction,
wherein the plurality of second portions of the third semiconductor region extend in a second direction intersecting the first direction.

9. The photoelectric conversion device according to claim 1, wherein the third semiconductor region and the fifth semiconductor region are electrically connected to the first semiconductor region in the first portion.

10. The photoelectric conversion device according to claim 1,
wherein the third semiconductor region and the fifth semiconductor region are a part of an eighth semiconductor region of the first conductivity type provided from the first depth to the third depth, and
wherein an impurity concentration of the first conductivity type at the second depth is the same in the eighth semiconductor region and the fourth semiconductor region.

11. The photoelectric conversion device according to claim 1 further comprising a ninth semiconductor region of the second conductivity type that is provided at a fourth depth that is deeper than the third depth and overlaps a whole forming region of the photoelectric conversion unit in the plan view.

12. The photoelectric conversion device according to claim 1, wherein the charge conversion circuit is of a charge integration type.

13. The photoelectric conversion device according to claim 1 further comprising a scintillator that converts a radioactive ray into a visible light, wherein the photoelectric conversion unit generates the signal charge based on the visible light received from the scintillator.

14. A radioactive ray imaging system comprising:
the photoelectric conversion device according to claim 13; and
a control device that processes an image signal obtained at the photoelectric conversion device.

15. An imaging system comprising:
the photoelectric conversion device according to claim 1; and
a signal processing unit that processes a signal output from the photoelectric conversion device.

16. A movable object comprising:
the photoelectric conversion device according to claim 1;
a distance information acquisition unit that acquires distance information on a distance to an object, from a parallax image based on signals from the photoelectric conversion device; and
a control unit that controls the movable object based on the distance information.

17. A photoelectric conversion device comprising:
a photoelectric conversion unit that generates a signal charge of a first polarity in response to incident light; and
a charge conversion circuit that converts the signal charge into a signal voltage,
wherein the photoelectric conversion unit includes:
a first semiconductor region of a first conductivity type that is provided in a surface side of a semiconductor substrate and in which carriers of the first polarity are major carriers,
a second semiconductor region of a second conductivity type that is provided in the surface side of the semiconductor substrate so as to be spaced apart from the first semiconductor region and in which carriers of a second polarity that is different from the first polarity are major carriers,
a third semiconductor region of the first conductivity type that is provided at a first depth that is deeper than a depth at which the second semiconductor region is provided,
a fourth semiconductor region of the second conductivity type that is provided at a second depth that is deeper than a depth at which the third semiconductor region is provided and overlaps the second semiconductor region in a plan view, and
a fifth semiconductor region of the first conductivity type,
wherein the third semiconductor region and the fifth semiconductor region overlap the first semiconductor region, the second semiconductor region, and the fourth semiconductor region in the plan view, and
wherein the photoelectric conversion unit further includes a sixth semiconductor region of the second conductivity type provided at the first depth and a seventh semiconductor region of the second conductive region provided at the third depth that is deeper than a depth at which the fourth semiconductor region is provided,
wherein an outer edge of the third semiconductor region in the plan view is defined by a junction between the third semiconductor region and the sixth semiconductor region, and
wherein an outer edge of the fifth semiconductor region in the plan view is defined by a junction between the fifth semiconductor region and the seventh semiconductor region.

18. The photoelectric conversion device according to claim 17,
wherein the third semiconductor region and the fifth semiconductor region are a part of an eighth semiconductor region of the first conductivity type provided from the first depth to the third depth, and
wherein an impurity concentration of the first conductivity type at the second depth is the same in the eighth semiconductor region and the fourth semiconductor region.

19. The photoelectric conversion device according to claim 17 further comprising a ninth semiconductor region of the second conductivity type that is provided at a fourth depth that is deeper than the third depth and overlaps a whole forming region of the photoelectric conversion unit in the plan view.

* * * * *